(12) United States Patent
Lim et al.

(10) Patent No.: US 6,403,484 B1
(45) Date of Patent: Jun. 11, 2002

(54) METHOD TO ACHIEVE STI PLANARIZATION

(75) Inventors: Victor Seng Keong Lim, Singapore (SG); Lap Chan, San Francisco, CA (US); James Lee, Singapore (SG); Chen Feng, Singapore (SG); Wang Ling Goh, Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 09/803,187

(22) Filed: Mar. 12, 2001

(51) Int. Cl.[7] .............................................. H01L 21/00
(52) U.S. Cl. ........................ 438/692; 216/38; 216/79; 216/88; 216/99; 438/723; 438/745; 438/756; 438/757
(58) Field of Search ................................ 438/424, 425, 438/427, 692, 697, 723, 745, 756, 757; 216/38, 79, 88, 99

(56) References Cited

U.S. PATENT DOCUMENTS

| 5,173,439 A | 12/1992 | Dash et al. ............... 437/67 |
| 5,441,094 A | 8/1995 | Pasch ...................... 156/636.1 |
| 5,498,565 A | 3/1996 | Gocho et al. ............. 437/67 |
| 5,665,202 A | 9/1997 | Subramanian et al. ..... 438/692 |
| 5,721,172 A | 2/1998 | Jang et al. ................ 438/424 |
| 5,721,173 A | 2/1998 | Yano et al. ............... 438/424 |
| 5,792,707 A | 8/1998 | Chung ....................... 438/633 |
| 5,817,567 A | 10/1998 | Jang et al. ................ 438/427 |
| 5,880,007 A | 3/1999 | Varian et al. ............. 438/427 |
| 6,048,775 A | 4/2000 | Yao et al. .................. 438/427 |
| 6,057,207 A | 5/2000 | Lin et al. .................. 438/424 |
| 6,057,210 A | 5/2000 | Yang et al. ............... 438/427 |

*Primary Examiner*—William A. Powell
(74) *Attorney, Agent, or Firm*—George O. Saile; Rosemary L.S. Pike

(57) ABSTRACT

A method of forming shallow trench isolations is described. A plurality of isolation trenches are etched through a first etch stop layer into the underlying semiconductor substrate. An oxide layer is deposited over the first etch stop layer and within the isolation trenches using a high density plasma chemical vapor deposition process (HDP-CVD) wherein after the oxide layer fills the isolation trenches, the deposition component is discontinued while continuing the sputtering component until corners of the first etch stop layer are exposed at edges of the isolation trenches whereby the oxide layer within the isolation trenches is disconnected from the oxide layer overlying the first etch stop layer. Thereafter, a second etch stop layer is deposited overlying the oxide layer within the isolation trenches, the oxide layer overlying the first etch stop layer, and the exposed first etch stop layer corners. The second etch stop layer is polished away until the oxide layer overlying the first etch stop layer is exposed. The exposed oxide layer overlying the first etch stop layer is removed. The first and second etch stop layers are removed to complete the planarized shallow trench isolation regions in the manufacture of an integrated circuit device.

20 Claims, 3 Drawing Sheets

METHOD TO ACHIEVE STI PLANARIZATION

BACKGROUND OF THE INVENTION (1) Field of the Invention

The invention relates to a method of fabricating semiconductor structures, and more particularly, to a method of forming planarized shallow trench isolation structures in the manufacture of integrated circuit devices.

(2) Description of the Prior Art

Shallow trench isolation (STI) is now commonly used in the art as an alternative to local oxidation of silicon (LOCOS) for forming isolations between active device areas in the integrated circuit. STI offers the advantages of smaller isolation area and better surface planarization when compared to LOCOS. However, the STI process suffers from dishing, especially over large trenches. Dishing can cause excessive device leakage in some cases. Currently, reverse masking and dummy active structures are the most commonly employed methods to prevent dishing during the STI chemical mechanical polishing (CMP) process. However, reverse masking steps incur additional processing costs. Dummy structures, on the other hand, cause an increase in parasitic capacitance that is not favorable, especially in mixed signal processes.

Co-pending U.S. patent application Ser. No. 09/439,357 (CS-99-059) to James Lee, filed on Nov. 15, 1999, teaches a new technique for preventing dishing in an STI process. This process requires an additional HF dip step. Several prior art approaches disclose methods to form and planarize shallow trench isolations. U.S. Pat. No. 6,057,210 to Yang et al shows a process in which corners of the silicon nitride areas are exposed using a wet etch. U.S. Pat. No. 5,441,094 to Pasch shows an STI process. U.S. Pat. No. 5,665,202 to Subramanian et al discloses an STI process in which varying pad pressure controls polish selectivity in the chemical mechanical polish (CMP) operation. U.S. Pat. No. 5,817,567 to Jang et al teaches a STI process in which a CMP process removes a silicon nitride layer and underlying oxide peaks. A single etch is used to remove both the remaining silicon nitride and a portion of the oxide. A second CMP is used to polish down the oxide to the top surface of the trench edges. U.S. Pat. No. 5,173,439 to Dash et al teaches another STI process using a polysilicon layer to shield the oxide in wide trenches. U.S. Pat. No. 5,880,007 to Varian et al teaches a polysilicon layer over HDP oxide within trenches. CMP exposes the oxide, then the polysilicon and oxide are etched separately followed by an oxide CMP. U.S. Pat. No. 5,792,707 to Chung teaches a reverse mask process. U.S. Pat. No. 5,498,565 to Gocho et al discloses several STI processes. U.S. Pat. No. 5,721,173 to Yano et al, U.S. Pat. No. 6,057,207 to Lin et al, U.S. Pat. No. 6,048,775 to Yao et al, and U.S. Pat. No. 5,721,172 to Jang et al show other related STI processes.

SUMMARY OF THE INVENTION

A principal object of the present invention is to provide an effective and very manufacturable method of fabricating shallow trench isolations in the manufacture of integrated circuits.

A further object of the present invention is to provide a method to fabricate shallow trench isolations where oxide dishing is eliminated.

Another object of the present invention is to provide a method to fabricate shallow trench isolations where the final thickness of the trench oxide is better controlled.

Yet another object of the invention is to provide a method to fabricate shallow trench isolations wherein oxide dishing is eliminated and the final thickness of the trench oxide is better controlled and wherein processing steps are minimized.

In accordance with the objects of this invention, a new method of forming shallow trench isolations has been achieved. A first etch stop layer is deposited on the surface of a semiconductor substrate. A plurality of isolation trenches are etched through the first etch stop layer into the semiconductor substrate. An oxide layer is deposited over the first etch stop layer and within the isolation trenches using a high density plasma chemical vapor deposition process (HDP-CVD) having a deposition component and a sputtering component wherein after the oxide layer fills the isolation trenches, the deposition component is discontinued while continuing the sputtering component until corners of the first etch stop layer are exposed at edges of the isolation trenches whereby the oxide layer within the isolation trenches is disconnected from the oxide layer overlying the first etch stop layer. Thereafter, a second etch stop layer is deposited overlying the oxide layer within the isolation trenches, the oxide layer overlying the first etch stop layer, and the exposed first etch stop layer corners. The second etch stop layer is polished away until the oxide layer overlying the first etch stop layer is exposed. The exposed oxide layer overlying the first etch stop layer is removed wherein the second etch stop layer protects the oxide layer within the isolation trenches during the removing. The first and second etch stop layers are removed to complete the planarized shallow trench isolation regions in the manufacture of an integrated circuit device.

BRIEF DESCRIPTION OF THE DRAWINGS

In the accompanying drawings forming a material part of this description, there is shown.

DESCRIPTION OF THE PREFERRED EMBODIMENTS

The present invention is an improvement over the co-pending U.S. patent application Ser. No. 09/439,357 (CS-99-059) to James Lee. The present invention achieves the prevention of oxide dishing and uniformity control of the oxide thickness as does the co-pending application. However, the present invention offers the further advantage of eliminating a HF dip step.

Figure 1:
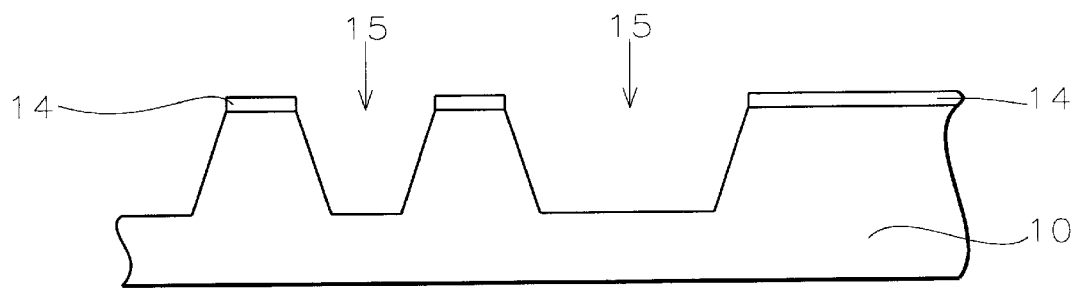
FIGS. 1 through 7 schematically illustrate in cross-sectional representation a preferred embodiment of the present invention.

Referring now more particularly to FIG. 1, there is shown a cross section of a partially completed integrated circuit device of the preferred embodiment. A semiconductor substrate 10, typically consisting of monocrystalline silicon, is provided. A first etch stop layer 14 is deposited overlying the semiconductor substrate 10. The first etch stop layer 14 acts as a stop for the subsequent etching of the gap fill layer. The first etch stop layer 14 is preferably comprised of silicon nitride and is deposited by low-pressure chemical vapor deposition (LPCVD). The first etch stop layer 14 is deposited to a thickness of between about 1000 and 2000 Angstroms.

The first etch stop layer 14 and the semiconductor substrate 10 are etched to form trenches 15 for planned shallow trench isolations that define wide and narrow active areas. For example, narrow active area 11 has a width of less than about 0.5 $\mu$m while wide active area 12 has a width of greater than about 1.0 μm. The trenches are etched using a conventional etching process such as reactive ion etching (RIE).

Figure 2:
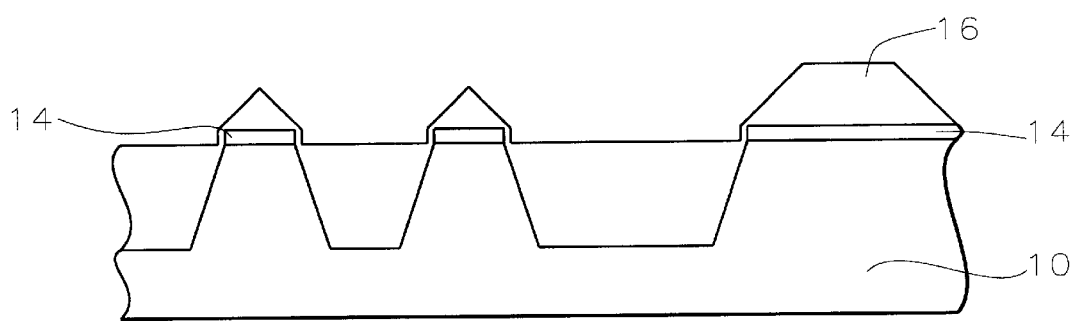

Referring now to FIG. 2, a gap fill layer 16 of high density plasma (HDP) oxide is deposited overlying the first etch stop layer 14 and filling the trenches. HDP oxide is used because of the excellent gap filling properties of this process. In an HDP plasma process, the silicon dioxide material is deposited and etched simultaneously in the same reaction. This process causes the silicon dioxide to be deposited very densely and with no voids. In addition, the etching process causes the HDP oxide to assume the near 45 degree angle profile at trench corners as shown in the illustration. In addition, a densification step is performed.

Figure 3:
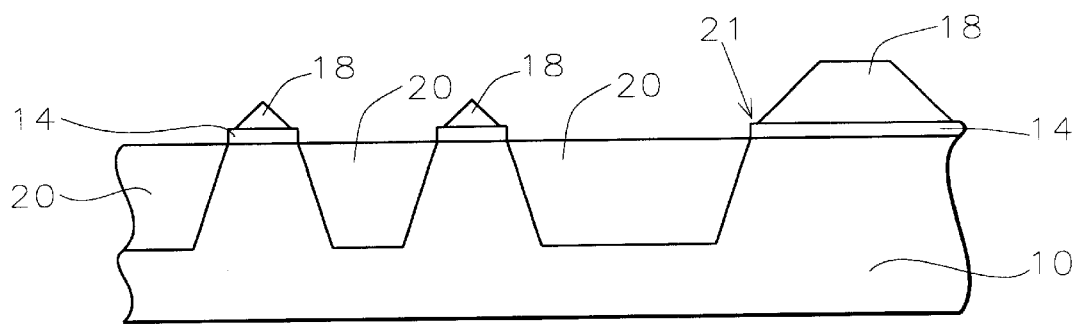

After the correct amount of HDP oxide is deposited to fill the trenches, the deposition component of the HDP process is turned off, but the sputtering component is continued. Under sputtering, the horizontal dimension reduces much faster than the vertical dimension. Sputtering is continued until the etch stop layer 14 is exposed at the corners of the trench region, as shown in FIG. 3. This sputtering step breaks the connection between the oxide 20 within the trenches and the oxide 18 overlying the etch stop layer 14. The sputtering component is stopped especially when the silicon nitride layer 14 is exposed 21 on the wide active areas 12. The deposition and sputter-back step just described are performed in-situ, as one step in the HDP chemical vapor deposition (CVD) process.

In the co-pending Patent Application, an extra step was required to break this connection using an HF dip. The present invention saves a step by simply continuing the sputtering component, but not the deposition component, of the HDP CVD process. This increases efficiency of the inventive process.

Figure 4:
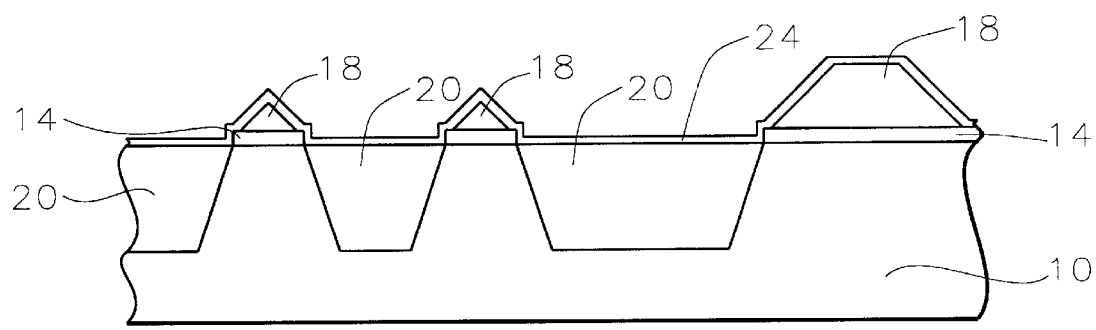

Referring now to FIG. 4, a second etch stop layer 24 is deposited overlying the HDP oxide layer 18 and 20 and the first etch stop layer 14. The purpose of the second etch stop layer 24 is to protect the gap fill layer 20 within the trenches. The second etch stop layer 24 preferably comprises silicon nitride deposited using a low-pressure chemical vapor deposition (LPCVD) or a thermal CVD nitride process to a thickness of between about 1000 and 2000 Angstroms.

Figure 5:
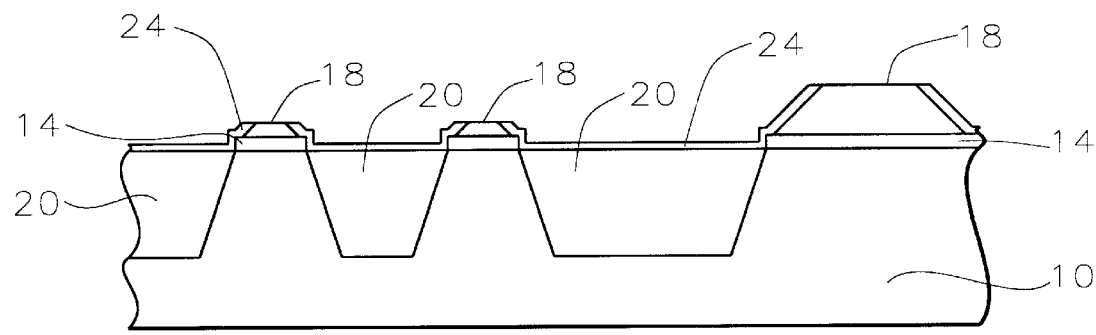

Referring now to FIG. 5, a chemical mechanical polishing (CMP) step is performed to remove the etch stop layer 24 on top of the oxide peaks 18. The oxide 18 acts as a polish stop layer.

Figure 6:
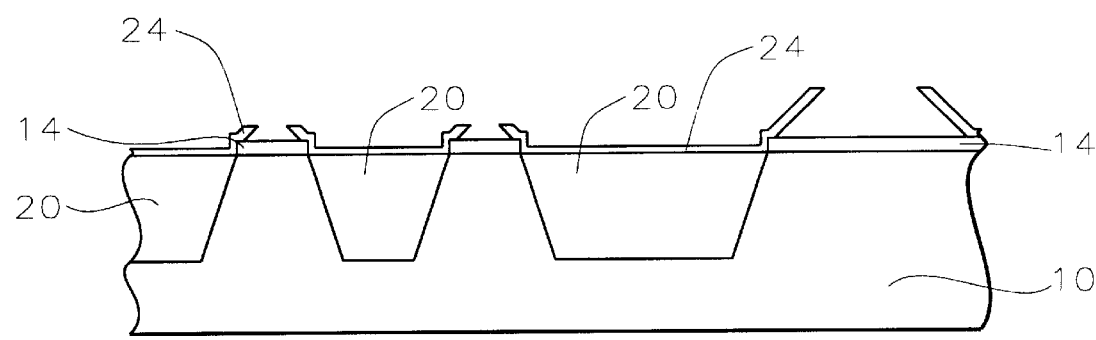

Referring now to FIG. 6, the exposed oxide peaks 18 are etched away using a hydrofluoric acid (HF) dip. The second etch stop layer 24 protects the oxide layer 20 in the trenches during the etch of the oxide peaks 18.

Figure 7:
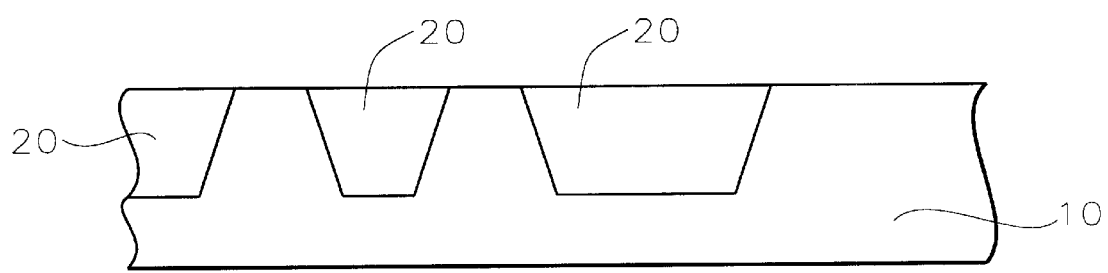

Finally, the first and second etch stop layers 14 and 24 are stripped, preferably using a hot phosphoric acid ($H_3PO_4$) that will remove the first etch stop layer 14 and the second etch stop layer 24 without etching the oxide fill layer 20, as shown in FIG. 7. The etching step leaves the gap fill layer 20 formed to a well-controlled thickness. In addition no dishing of the gap fill layer below the substrate top surface occurs.

This completes fabrication of the shallow trench isolation regions. The shallow trench isolation has been formed without dishing and to a uniform thickness. The process of the present invention is an improvement over the co-pending patent application because it eliminates an etching step.

While the invention has been particularly shown and described with reference to the preferred embodiments thereof, it will be understood by those skilled in the art that various changes in form and details may be made without departing from the spirit and scope of the invention.

What is claimed is:

1. A method of forming shallow trench isolation regions in the manufacture of an integrated circuit device comprising:

depositing a first etch stop layer on the surface of a semiconductor substrate;

etching a plurality of isolation trenches through said first etch stop layer into said semiconductor substrate;

depositing an oxide layer over said first etch stop layer and within said isolation trenches using a high density plasma chemical vapor deposition process (HDP-CVD) having a deposition component and a sputtering component wherein after said oxide layer fills said isolation trenches, said deposition component is discontinued while continuing said sputtering component until corners of said first etch stop layer are exposed at edges of said isolation trenches whereby said oxide layer within said isolation trenches is disconnected from said oxide layer overlying said first etch stop layer;

thereafter depositing a second etch stop layer overlying said oxide layer within said isolation trenches, said oxide layer overlying said first etch stop layer, and exposed said first etch stop layer corners;

polishing away said second etch stop layer until said oxide layer overlying said first etch stop layer is exposed;

removing exposed said oxide layer overlying said first etch stop layer wherein said second etch stop layer protects said oxide layer within said isolation trenches during said removing; and removing said first and second etch stop layers to complete planarized said shallow trench isolation regions in said manufacture of said integrated circuit device.

2. The method according to claim 1 wherein said first etch stop layer comprises silicon nitride and is deposited by chemical vapor deposition to a thickness of between about 1000 and 2000 Angstroms.

3. The method according to claim 1 wherein said second etch stop layer comprises silicon nitride and is deposited by chemical vapor deposition to a thickness of between about 1000 and 2000 Angstroms.

4. The method according to claim 1 wherein said step of polishing away said second etch stop layer comprises chemical mechanical polishing (CMP).

5. The method according to claim 1 wherein said step of removing said oxide layer overlying said first etch stop layer comprises a hydrofluoric acid (HF) dip.

6. The method according to claim 1 wherein said step of removing said first and second etch stop layers comprises a hot phosphoric acid ($H_3PO_4$) dip.

7. The method according to claim 1 further comprising fabricating semiconductor device structures in and on said semiconductor substrate between said isolation trenches.

8. A method of forming shallow trench isolation regions in the manufacture of an integrated circuit device comprising:

depositing a first silicon nitride layer on the surface of a semiconductor substrate;

etching a plurality of isolation trenches through said first silicon nitride layer into said semiconductor substrate wherein said isolation trenches separate active areas wherein some of said active areas have a width of less than 0.5 μm and others of said active areas have a width of more than 1.0 μm;

depositing an oxide layer over said first silicon nitride layer and within said isolation trenches using a high density plasma chemical vapor deposition process (HDP-CVD) having a deposition component and a sputtering component wherein after said oxide layer fills said isolation trenches, said deposition component is discontinued while continuing said sputtering component until corners of said first silicon nitride layer are exposed at edges of said isolation trenches whereby said oxide layer within said isolation trenches is disconnected from said oxide layer overlying said first silicon nitride layer;

thereafter depositing a second silicon nitride layer overlying said oxide layer within said isolation trenches, said oxide layer overlying said first silicon nitride layer, and exposed said first silicon nitride layer corners;

polishing away said second silicon nitride layer until said oxide layer overlying said first silicon nitride layer is exposed;

removing exposed said oxide layer overlying said first silicon nitride layer wherein said second silicon nitride layer protects said oxide layer within said isolation trenches during said removing; and removing said first and second silicon nitride layers to complete planarized said shallow trench isolation regions in said manufacture of said integrated circuit device.

9. The method according to claim 8 wherein said first silicon nitride layer is deposited by chemical vapor deposition to a thickness of between about 1000 and 2000 Angstroms.

10. The method according to claim 8 wherein said second silicon nitride layer is deposited by chemical vapor deposition to a thickness of between about 1000 and 2000 Angstroms.

11. The method according to claim 8 wherein said step of polishing away said second silicon nitride layer comprises chemical mechanical polishing (CMP).

12. The method according to claim 8 wherein said step of removing said oxide layer overlying said first silicon nitride layer comprises a hydrofluoric acid (HF) dip.

13. The method according to claim 8 wherein said step of removing said first and second silicon nitride layers comprises a hot phosphoric acid ($H_3PO_4$) dip.

14. The method according to claim 8 further comprising fabricating semiconductor device structures in and on said semiconductor substrate between said isolation trenches.

15. A method of forming shallow trench isolation regions in the manufacture of an integrated circuit device comprising:

depositing a first silicon nitride layer on the surface of a semiconductor substrate;

etching a plurality of isolation trenches through said first silicon nitride layer into said semiconductor substrate wherein said isolation trenches separate active areas wherein some of said active areas have a width of less than 0.5 $\mu$m and others of said active areas have a width of more than 1.0 $\mu$m;

depositing an oxide layer over said first silicon nitride layer and within said isolation trenches using a high density plasma chemical vapor deposition process (HDP-CVD) having a deposition component and a sputtering component wherein after said oxide layer fills said isolation trenches, said deposition component is discontinued while continuing said sputtering component until corners of said first silicon nitride layer are exposed at edges of said isolation trenches whereby said oxide layer within said isolation trenches is disconnected from said oxide layer overlying said first silicon nitride layer;

thereafter depositing a second silicon nitride layer overlying said oxide layer within said isolation trenches, said oxide layer overlying said first silicon nitride layer, and exposed said first silicon nitride layer corners;

polishing away said second silicon nitride layer until said oxide layer overlying said first silicon nitride layer is exposed;

removing exposed said oxide layer overlying said first silicon nitride layer using a hydrofluoric acid dip wherein said second silicon nitride layer protects said oxide layer within said isolation trenches during said removing; and removing said first and second silicon nitride layers to complete planarized said shallow trench isolation regions in said manufacture of said integrated circuit device.

16. The method according to claim 15 wherein said first silicon nitride layer is deposited by chemical vapor deposition to a thickness of between about 1000 and 2000 Angstroms.

17. The method according to claim 15 wherein said second silicon nitride layer is deposited by chemical vapor deposition to a thickness of between about 1000 and 2000 Angstroms.

18. The method according to claim 15 wherein said step of polishing away said second silicon nitride layer comprises chemical mechanical polishing (CMP).

19. The method according to claim 15 wherein said step of removing said first and second silicon nitride layers comprises a hot phosphoric acid ($H_3PO_4$) dip.

20. The method according to claim 15 further comprising fabricating semiconductor device structures in and on said semiconductor substrate between said isolation trenches.

* * * * *